United States Patent
Igarashi et al.

(10) Patent No.: US 11,177,125 B2
(45) Date of Patent: Nov. 16, 2021

(54) METHOD FOR CLEANING SEMICONDUCTOR WAFER

(71) Applicant: SHIN-ETSU HANDOTAI CO., LTD., Tokyo (JP)

(72) Inventors: Kensaku Igarashi, Nishigo-mura (JP); Tatsuo Abe, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/491,294

(22) PCT Filed: Mar. 5, 2018

(86) PCT No.: PCT/JP2018/008197
§ 371 (c)(1),
(2) Date: Sep. 5, 2019

(87) PCT Pub. No.: WO2018/180224
PCT Pub. Date: Oct. 4, 2018

(65) Prior Publication Data
US 2020/0027721 A1   Jan. 23, 2020

(30) Foreign Application Priority Data
Mar. 29, 2017   (JP) ................ JP2017-65628

(51) Int. Cl.
*H01L 21/02* (2006.01)
*H01L 21/67* (2006.01)
*B08B 3/08* (2006.01)

(52) U.S. Cl.
CPC ......... *H01L 21/02057* (2013.01); *B08B 3/08* (2013.01); *H01L 21/67057* (2013.01)

(58) Field of Classification Search
CPC ......... H01L 21/02057; H01L 21/67057; H01L 21/02052; H01L 21/304; B08B 3/08; C11D 7/08; C11D 11/0047
See application file for complete search history.

(56) References Cited

U.S. PATENT DOCUMENTS 5,415,698 A * 5/1995 Fujinaga ........... H01L 21/02052
134/25.1
5,651,836 A * 7/1997 Suzuki ................. B08B 3/102
134/34

(Continued)

FOREIGN PATENT DOCUMENTS

| JP | H06-077201 A | 3/1994 |
| JP | H09-283483 A | 10/1997 |

(Continued)

OTHER PUBLICATIONS

May 15, 2018 International Search Report issued in International Patent Application No. PCT/JP2018/008197.

(Continued)

*Primary Examiner* — Nadine G Norton
*Assistant Examiner* — Christopher Remavege
(74) *Attorney, Agent, or Firm* — Oliff PLC

(57) ABSTRACT

A method for cleaning a semiconductor wafer, including: inserting a semiconductor wafer into a hydrofluoric acid tank filled with hydrofluoric acid to immerse the semiconductor wafer in the hydrofluoric acid; pulling out the semiconductor wafer from the hydrofluoric acid tank; and then inserting the semiconductor wafer into an ozone water tank filled with ozone water to immerse the semiconductor wafer in the ozone water for cleaning. The semiconductor wafer is inserted into the ozone water tank at a rate of 20000 mm/min or more at least after a lower end of the semiconductor wafer comes into contact with the ozone water until the semiconductor wafer is completely immersed in the ozone water. A (Continued)

method for cleaning a semiconductor wafer which can prevent and remove contaminant from re-adhering in a method in which a semiconductor wafer is cleaned by immersion in hydrofluoric acid and then cleaned by immersion in ozone water.

4 Claims, 2 Drawing Sheets

(56) References Cited

U.S. PATENT DOCUMENTS

| | | | |
|---|---|---|---|
| 5,662,743 A * | 9/1997 | Nakano | H01L 21/02052 134/3 |
| 5,665,168 A * | 9/1997 | Nakano | H01L 21/02052 134/2 |
| 5,837,662 A | 11/1998 | Chai et al. | |
| 6,165,279 A * | 12/2000 | Tsao | C11D 7/02 134/2 |
| 6,199,564 B1 * | 3/2001 | Yokomizo | H01L 21/67051 134/135 |
| 6,558,476 B2 * | 5/2003 | Yokomizo | H01L 21/67051 134/135 |

FOREIGN PATENT DOCUMENTS

| | | |
|---|---|---|
| JP | 2017-011005 A | 1/2017 |
| TW | 419399 B | 1/2001 |

OTHER PUBLICATIONS

May 5, 2021 Office Action issued in Taiwanese Patent Application No. 107107974.

\* cited by examiner

[FIG. 1]
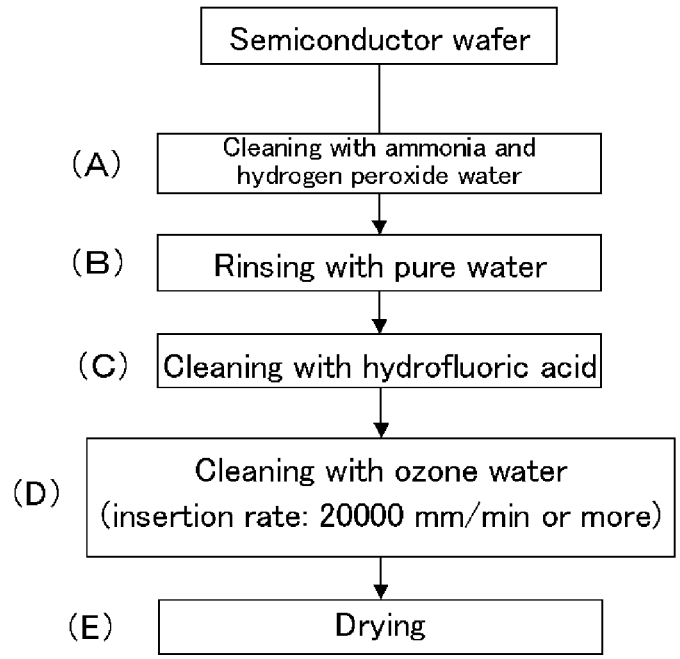
[FIG. 2]
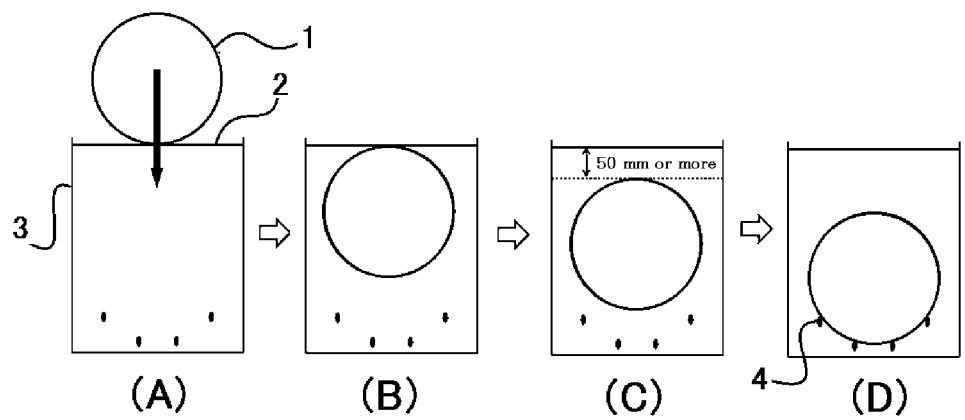

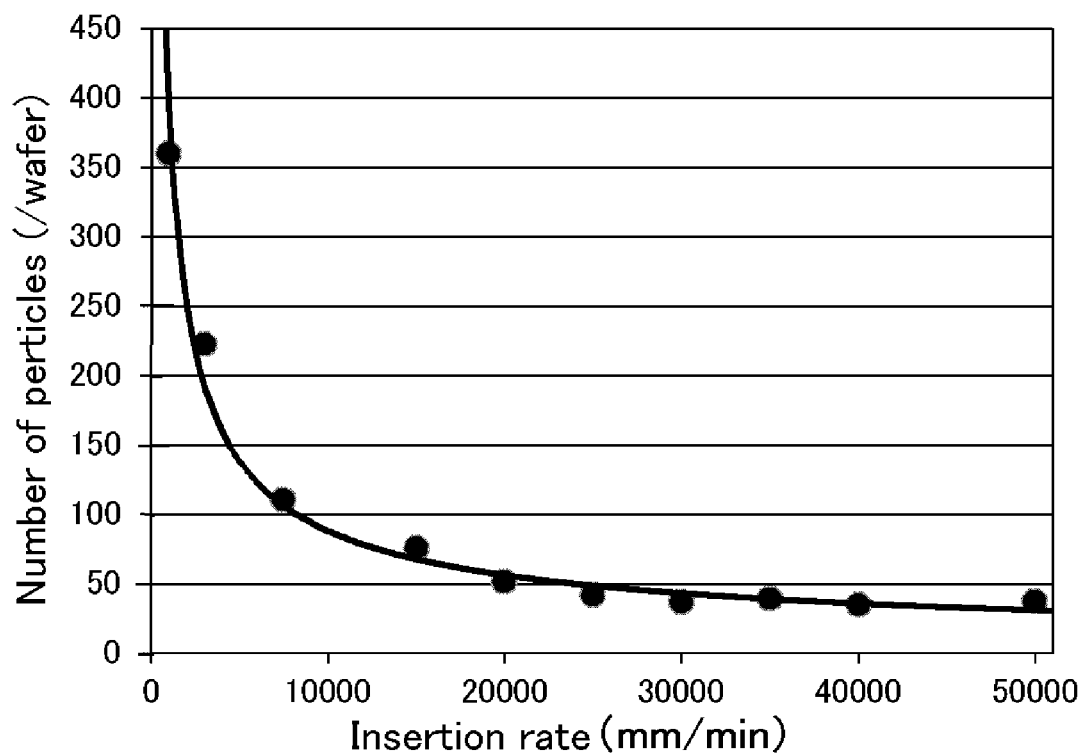
[FIG. 3]

METHOD FOR CLEANING SEMICONDUCTOR WAFER

TECHNICAL FIELD

The present invention relates to a method for cleaning a semiconductor wafer.

BACKGROUND ART

At present, immersion cleaning using hydrofluoric acid (HF) and ozone water is a common method to clean semiconductor wafers in a batch. In this method, an oxide film on a wafer is removed by HF cleaning and contaminants such as particles are simultaneously removed thereby. Then, the wafer is oxidized by cleaning with ozone water to form a native oxide film and to remove residual contaminants such as particles.

Heretofore, it has been known, regarding this event, that the rate of pulling up (pulling out) a semiconductor wafer from a cleaning tank filled with a cleaning solution (pull-up rate) is more important than the rate of immersing (inserting) the semiconductor wafer into the cleaning tank (immersion rate) (for example, Patent Document 1).

Conventionally, to reduce contaminants such as particles adhering on a semiconductor wafer, the pull-up rate from a hydrofluoric acid tank is decreased.

CITATION LIST

Patent Literature

Patent Document 1: Japanese Unexamined Patent Application Publication No. H09-283483

SUMMARY OF INVENTION

Technical Problem

When a native oxide film is removed from a semiconductor wafer by cleaning with hydrofluoric acid, the semiconductor wafer is brought into such a state that a bare surface (hydrophobic surface) thereof is exposed. In the step of cleaning (oxidizing) such a wafer having an exposed bare surface by using an ozone water tank in a conventional process, the immersion (insertion) rate into the ozone water tank has been set constant without modification during the course, generally set as low as approximately 10000 ram/min.

Meanwhile, in the cleaning step with an ozone water tank, contaminants such as particles are simultaneously removed during the oxide film formation. However, it has been found that the slow immersion rate brings about a problem that since relative speeds between ozone water and the semiconductor wafer are slow, particles are scarcely detached and the particles and similar contaminants remain.

Further, in general, the direction in which a solution of ozone water flows is from lower to higher positions. For this reason, detached contaminants such as particles are likely to stagnate near a liquid surface in the cleaning tank. Hence, another problem has been found that if the immersion rate is slow, detached particles re-adhere to a spot on a wafer where the oxidation has progressed incompletely.

The present invention has been made in view of the above problems. An object of the present invention is to provide a method for cleaning a semiconductor wafer which makes it possible to prevent contaminants such as particles from remaining and removed contaminants from re-adhering in a method in which a semiconductor wafer is cleaned by immersion in hydrofluoric acid and then cleaned by immersion in ozone water.

Solution to Problem

To achieve the object, the present invention provides a method for cleaning a semiconductor wafer, including:
  inserting a semiconductor wafer into a hydrofluoric acid tank filled with hydrofluoric acid to immerse the semiconductor wafer in the hydrofluoric acid;
  pulling out the semiconductor wafer from the hydrofluoric acid tank; and
  then inserting the semiconductor wafer into an ozone water tank filled with ozone water to immerse the semiconductor wafer in the ozone water for cleaning, wherein
  the semiconductor wafer is inserted into the ozone water tank at an insertion rate of 20000 ram/min or more at least after a lower end of the semiconductor wafer comes into contact with the ozone water until the semiconductor wafer is completely immersed in the ozone water.

Such a method for cleaning a semiconductor wafer is capable of preventing contaminants such as particles from remaining and removed contaminants from re-adhering. Moreover, the transport rate is consequently increased, thus enhancing the throughput.

Moreover, in this case, the semiconductor wafer is preferably pulled out from the hydrofluoric acid tank at a pull-out rate of 1000 mm/min or less.

Decreasing the pull-out rate from the hydrofluoric acid tank in this manner enables further reduction of contaminants such as particles.

Furthermore, in this case, the semiconductor wafer is preferably inserted into the ozone water tank at the insertion rate of 20000 mm/min or more after the lower end of the semiconductor wafer comes into contact with the ozone water until an upper end of the semiconductor wafer is located 50 mm or more from a liquid surface of the ozone water.

Inserting a semiconductor wafer into the ozone water tank as described above is preferable because this makes it possible to surely prevent adhesion of contaminants such as particles stagnating near a liquid surface in the ozone water tank.

In addition, a silicon wafer is preferably cleaned as the semiconductor wafer.

The inventive cleaning method is particularly effective when a silicon wafer is cleaned.

Advantageous Effects of Invention

The inventive method for cleaning a semiconductor wafer makes it possible to prevent contaminants such as particles from remaining and removed contaminants from re-adhering in a cleaning method in which a semiconductor wafer is immersed into hydrofluoric acid to remove a native oxide film and then immersed into ozone water to form a native oxide film. Further, the inventive method also consequently increases the transport rate, so that the throughput is enhanced.

BRIEF DESCRIPTION OF DRAWINGS

FIG. 1 is a cleaning flowchart for illustrating an example of a method for cleaning a semiconductor wafer of the present invention.

FIG. 2 shows schematic drawings for illustrating a step of inserting a semiconductor wafer into an ozone water tank.

FIG. 3 is a graph for illustrating a relation between the insertion rates of a silicon wafer into an ozone water tank and the particle measurement results in Examples 1 to 6 and Comparative Examples 1 to 4.

DESCRIPTION OF EMBODIMENTS

As described above, in a method in which a semiconductor wafer is immersed in a hydrofluoric acid tank to remove a native oxide film and then immersed in an ozone water tank for the oxidation to form a native oxide film, the conventional cleaning process has problems that contaminants such as particles remain and removed contaminants re-adhere.

Then, the present inventors have keenly studied to solve the above problems. Consequently, the inventors have found that when a semiconductor wafer is inserted into an ozone water tank at a predetermined insertion rate or faster, contaminants such as particles can be prevented from remaining, and removed contaminants can be prevented from re-adhering. Thus, the inventors have arrived at the present invention.

Specifically, the present invention provides a method for cleaning a semiconductor wafer, including:

inserting a semiconductor wafer into a hydrofluoric acid tank filled with hydrofluoric acid to immerse the semiconductor wafer in the hydrofluoric acid;

pulling out the semiconductor wafer from the hydrofluoric acid tank; and then inserting the semiconductor wafer into an ozone water tank filled with ozone water to immerse the semiconductor wafer in the ozone water for cleaning, wherein the semiconductor wafer is inserted into the ozone water tank at an insertion rate of 20000 ram/min or more at least after a lower end of the semiconductor wafer comes into contact with the ozone water until the semiconductor wafer is completely immersed in the ozone water.

Note that, in the present invention, "insertion rate" refers to a relative speed between a semiconductor wafer and a cleaning tank. More specifically, the insertion rate includes all of: (i) a rate of lowering a semiconductor wafer when the semiconductor wafer is lowered and inserted at a predetermined position in a cleaning tank; (ii) a rate of elevating a cleaning tank when the cleaning tank is elevated to insert a semiconductor wafer at a predetermined position in the cleaning tank; (iii) a rate obtained by adding a rate of lowering a semiconductor wafer and a rate of elevating a cleaning tank when the semiconductor wafer is lowered and the cleaning tank is elevated at the same time; and so forth. Hereinafter, "pull-out rate" also similarly refers to a relative speed between a semiconductor wafer and a cleaning tank.

Hereinbelow, the inventive method for cleaning a semiconductor wafer will be described in detail. FIG. 1 shows a cleaning flowchart for illustrating an example of the inventive method for cleaning a semiconductor wafer.

In the present invention, the semiconductor wafer as a target to be cleaned is not particularly limited, and a silicon wafer can be used.

Before cleaning with hydrofluoric acid, the semiconductor wafer may be subjected to, for example, cleaning with ammonia and hydrogen peroxide water (SC1 cleaning) and rinsing with pure water (FIG. 1(A), (B)).

Next, the semiconductor wafer is inserted into a hydrofluoric acid tank filled with hydrofluoric acid to immerse the semiconductor wafer in hydrofluoric acid, so that the semiconductor wafer is cleaned with hydrofluoric acid (FIG. 1(C)). In this cleaning with hydrofluoric acid, a native oxide film formed on the semiconductor wafer is removed. The concentration and the temperature of the hydrofluoric acid are not limited, but the concentration is preferably 0.3 to 3.0%, and the temperature is preferably 10 to 30° C.

The semiconductor wafer is preferably pulled out from the hydrofluoric acid tank at a pull-out rate of 1000 mm/min or less. Pulling out the semiconductor wafer from the hydrofluoric acid tank at a relatively low rate as described above can further reduce contaminants such as particles. Note that the lower limit of the pull-out rate is not particularly limited, and may be a rate exceeding 0 mm/min.

Then, the semiconductor wafer is inserted into an ozone water tank filled with ozone water to immerse the semiconductor wafer in ozone water for cleaning (FIG. 1(D)).

FIG. 2 shows schematic drawings for illustrating the step of inserting the semiconductor wafer into the ozone water tank. The present invention is characterized in that when a semiconductor wafer 1 is inserted into an ozone water tank 3 filled with ozone water 2, this insertion rate is 20000 ram/min or more at least after a lower end of the semiconductor wafer 1 comes into contact with the ozone water 2 (FIG. 2(A)) until the semiconductor wafer 1 is completely immersed in the ozone water 2 (FIG. 2(B)). Meanwhile, the upper limit of the insertion rate is not particularly limited, and normally 50000 ram/min is the apparatus limit.

The surface of the semiconductor wafer 1 from which a native oxide film has been removed by the cleaning in the hydrofluoric acid tank is a bare surface (hydrophobic surface). Hence, contaminants such as particles are highly likely to adhere to the surface, and a large amount of contaminants adheres to the semiconductor wafer 1.

In the cleaning in the ozone water tank (re-oxidation treatment) after the cleaning in the hydrofluoric acid tank, if the semiconductor wafer 1 is immersed into the ozone water tank at a low rate (approximately 10000 mm/min) as in the conventional technique, contaminants such as particles are also to be removed simultaneously when an oxide film is formed; however, the relative speeds between the ozone water and the semiconductor wafer are so slow that particles are scarcely detached and the particles and similar contaminants remain.

Further, since a cleaning solution of ozone water flows in a direction from bottom to top, detached contaminants such as particles are likely to stagnate near a liquid surface in the ozone water tank. Hence, if the immersion rate is slow, detached particles re-adhere to a spot on a wafer where the oxidation has not progressed completely.

In contrast, as in the present invention, when the insertion rate of the semiconductor wafer 1 is set as fast as 20000 mm/min or more, particles are efficiently detached from the semiconductor wafer 1. Moreover, since the semiconductor wafer 1 is quickly sunk into the ozone water tank 3, fewer particles re-adhere near the liquid surface (tank interface), so that a high-quality wafer is obtained. Moreover, the transport rate is also increased consequently, so that the throughput is enhanced.

Moreover, in the present invention, the semiconductor wafer 1 is preferably inserted into the ozone water tank 3 at the insertion rate of 20000 ram/min or more after the lower end of the semiconductor wafer 1 comes into contact with the ozone water 2 (FIG. 2(A)) until an upper end of the semiconductor wafer 1 is located 50 mm or more from a liquid surface of the ozone water 2 (FIG. 2(C)). In this way, it is preferably possible to surely prevent the adhesion of the contaminants such as particles stagnating near the liquid surface of the ozone water tank 3. Meanwhile, in this event, the upper end of the semiconductor wafer 1 in FIG. 2(C) may be located 200 mm or less from the liquid surface of the ozone water 2.

The semiconductor wafer 1 inserted into the ozone water tank 3 as described above is immersed in the ozone water 2 while being held by a wafer holder 4 (FIG. 2(D)). The concentration of the ozone water is preferably 1 ppm or more, the temperature of the ozone water is preferably 10 to 30° C., and a preferable cleaning time is 60 to 300 seconds.

Then, the semiconductor wafer 1 is pulled out from the ozone water tank 3. In this case, the pull-out rate is not particularly limited, and can be 1000 mm/min or less. After the cleaning with the ozone water, a treatment such as drying (FIG. 1(E)) may be performed appropriately.

Note that, in the other tanks than the ozone water tank, increasing the insertion rate of the semiconductor wafer is expected to suppress the re-adhesion of particles and so forth and improve the throughput without any adverse influence. Thus, it is desirable to set high insertion rates into all the tanks, for example, as high as 20000 mm/min or more.

EXAMPLE

Hereinafter, the present invention will be more specifically described with reference to Examples and Comparative Example. However, the present invention is not limited to these Examples.

Examples 1 to 6, Comparative Examples 1 to 4

Silicon wafers each having a diameter of 300 mm were used and cleaned by dipping, that is, cleaning with ammonia hydrogen peroxide water→rinsing with pure water→cleaning with hydrofluoric acid→cleaning with ozone water in this order, and then dried. In this event, regarding the insertion rates of the silicon wafers into the ozone water tank after the lower end of each silicon wafer came into contact with ozone water until the upper end of the silicon wafer was located 50 mm from the liquid surface of the ozone water, the rates shown in Table 1 were selected. The insertion rates into the tanks other than the ozone water tank were 15000 mm/min, and the pull-out rates from all the tanks were 1000 mm/min.

After the drying, the number of particles 16 nm or more in diameter was counted with SP5 manufactured by KLA-Tencor Corporation. Table 1 shows the number of measured particles. FIG. 3 illustrates a relation between the insertion rates of the silicon wafers into the ozone water tank and the particle measurement results.

TABLE 1

|  | Comparative Example 1 | Comparative Example 2 | Comparative Example 3 | Comparative Example 4 | Example 1 | Example 2 | Example 3 | Example 4 | Example 5 | Example 6 |
| --- | --- | --- | --- | --- | --- | --- | --- | --- | --- | --- |
| Insertion rate (mm/min) | 1000 | 3000 | 7500 | 15000 | 20000 | 25000 | 30000 | 35000 | 40000 | 50000 |
| Number of particles | 360 | 223 | 111 | 76 | 52 | 42 | 37 | 40 | 35 | 38 |

As shown in Table 1 and FIG. 3, the higher the immersion rate into the ozone water tank, the smaller the number of particles on the silicon wafers. It was found that when the insertion rates were set at 20000 mm/min (Example 1) or more, the numbers of particles on the wafers converged and substantially stayed constant. In other words, Examples 1 to 6 achieved the improvements in the number of particles on the wafers, and enhanced the wafer quality.

Meanwhile, in Comparative Examples 1 to 4, larger numbers of particles were observed.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for cleaning a semiconductor wafer, the method comprising:
   inserting a semiconductor wafer into a hydrofluoric acid tank filled with hydrofluoric acid to immerse the semiconductor wafer in the hydrofluoric acid;
   pulling out the semiconductor wafer from the hydrofluoric acid tank; and
   then inserting the semiconductor wafer into an ozone water tank filled with ozone water to immerse the semiconductor wafer in the ozone water for cleaning, wherein the semiconductor wafer is inserted into the ozone water tank at an insertion rate of 20000 mm/min or more after a lower end of the semiconductor wafer comes into contact with the ozone water and until an upper end of the semiconductor wafer is located at a depth of 50 mm or more below a liquid surface of the ozone water.

2. The method for cleaning a semiconductor wafer according to claim 1, wherein the semiconductor wafer is pulled out from the hydrofluoric acid tank at a pull-out rate of 1000 mm/min or less.

3. The method for cleaning a semiconductor wafer according to claim 1, wherein a silicon wafer is cleaned as the semiconductor wafer.

4. The method for cleaning a semiconductor wafer according to claim 2, wherein a silicon wafer is cleaned as the semiconductor wafer.

\* \* \* \* \*